United States Patent [19]

Parker et al.

[11] 4,270,105
[45] May 26, 1981

[54] STABILIZED SURFACE WAVE DEVICE

[75] Inventors: Thomas E. Parker, Framingham; Clarence J. Dunnrowicz, Waltham, both of Mass.

[73] Assignee: Raytheon Company, Lexington, Mass.

[21] Appl. No.: 39,024

[22] Filed: May 14, 1979

[51] Int. Cl.³ .................. H03H 9/25; H03H 9/42; H03H 9/68
[52] U.S. Cl. ........................ 333/155; 310/313 A; 310/340; 333/194
[58] Field of Search ............ 427/100; 333/150–155, 333/193–196; 29/594, 25.35; 310/313, 340, 313 R, 313 A, 313 B, 313 C, 313 D

[56] References Cited

U.S. PATENT DOCUMENTS

| 2,769,930 | 11/1956 | Sturm | 310/340 |
| 3,885,173 | 5/1975 | Lee | 310/313 |
| 3,887,887 | 6/1975 | Wagers et al. | 333/151 |
| 3,987,378 | 10/1976 | Onodera | 310/313 X |
| 4,028,646 | 6/1977 | Ikushima et al. | 333/193 |
| 4,037,176 | 7/1977 | Ono et al. | 333/155 |
| 4,047,129 | 9/1977 | Ishiyama | 310/313 X |
| 4,096,455 | 6/1978 | Drummond | 310/313 X |
| 4,188,596 | 2/1980 | Miura | 333/151 |

FOREIGN PATENT DOCUMENTS 1389610  4/1975  United Kingdom ................ 333/150

OTHER PUBLICATIONS

*Websters Seventh New Collegiate Dictionary*, G and C Merriam Co., Springfield, Mass. ©1961; Title page and pp. 407,809.

Primary Examiner—Marvin L. Nussbaum
Attorney, Agent, or Firm—Vincenzo D. Pitruzzella; Joseph D. Pannone; Milton D. Bartlett

[57] ABSTRACT

A surface acoustic wave (SAW) device is provided with short-term and long-term stability by recessing the electrode structure into the surface of the piezoelectric crystal of the device. In addition, the surface is passivated with the silicon polymer, and a cover of the same crystalline material is placed above the electrode structure to prevent absorption of impurities into the surface from the atmosphere. The passivation is believed to reduce the effect of thermal agitation of the bonds of the crystal lattice structure, and thereby prevent the making and breaking of chemical bonds with hydroxyl ions that may have been entrapped from the atmosphere. The SAW device is particularly useful in the construction of stable oscillator circuits wherein the passivation provides improved short-term frequency stability and the cover provides long-term frequency stability.

6 Claims, 6 Drawing Figures

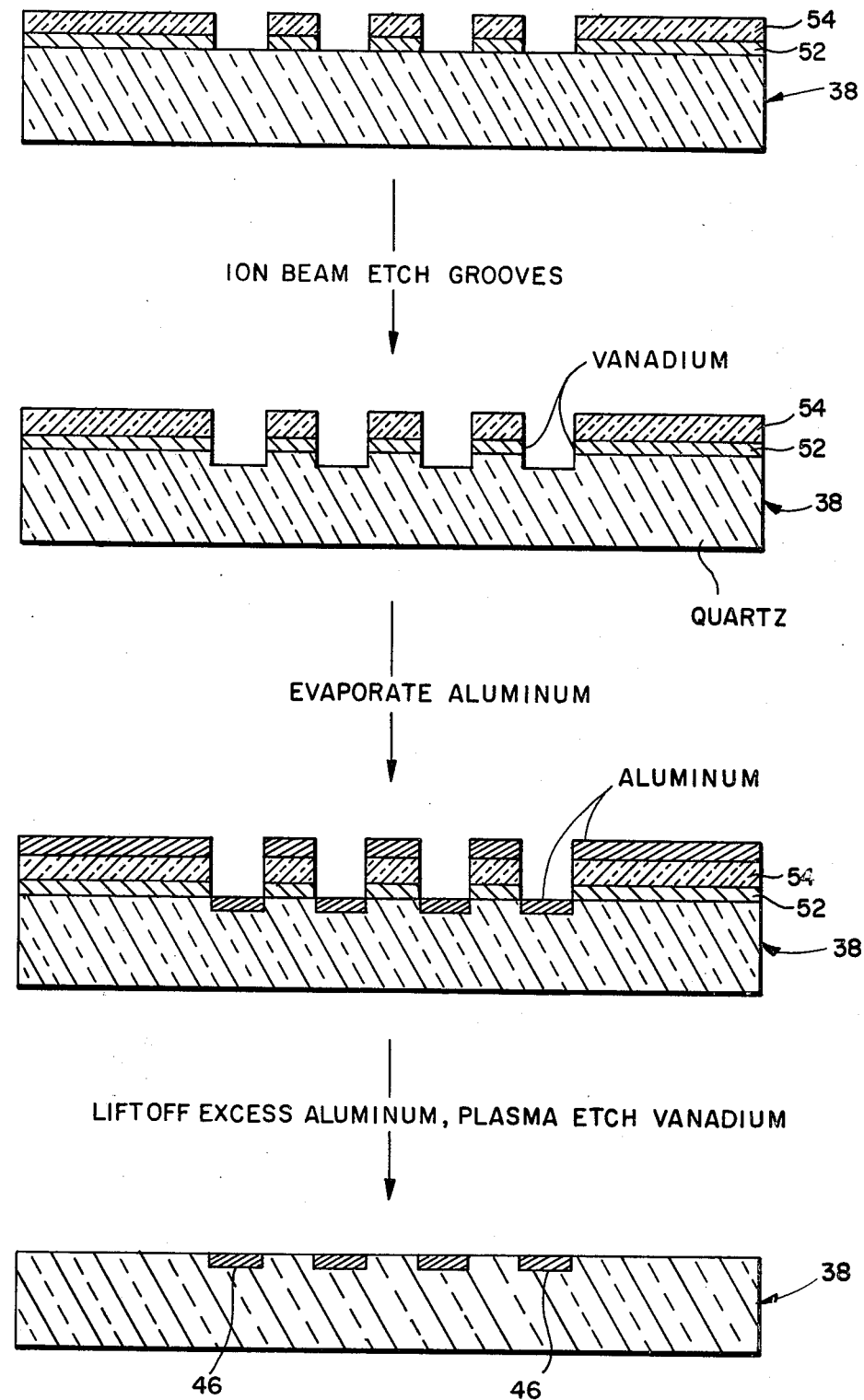

STABILIZED SURFACE WAVE DEVICE

BACKGROUND OF THE INVENTION

Surface acoustic wave (SAW) devices are fabricated by depositing an array of input electrodes and an array of output electrodes on the surface of a piezoelectric crystal such as a quartz crystal. The arrays of electrodes have the form of a line array which transmits sonic energy in the end fire direction along the surface of the crystal. The SAW device may be used as a filter or as a delay line with one array of electrodes being coupled to an input terminal and the other array of electrodes being coupled to an output terminal.

There is considerable interest in the utilization of SAW devices in the construction of oscillator circuits for use as a high fidelity signal generator. The delay of the delay line, or phase shift of the filter, of the SAW device is utilized to provide the necessary phase shift in the oscillator circuit for producing oscillation at a desired frequency. A SAW device is frequently utilized in an oscillator circuit for situations wherein it is desired to generate a signal having a relatively low noise content.

A problem arises in that presently available SAW device generate self-noise which places an upper limit on a signal-to-noise power ratio of a signal generated by a circuit employing the SAW device. It is recognized that a piezoelectric crystal is composed of molecules which are uniformly positioned in the crystal lattice structure. Such uniformity continues until the crystal surface whereupon a discontinuity in the molecular arrangement is found, the discontinuity involving polar molecules which display an affinity for polar water molecules. Thus, typically, there is found a loose bonding of hydroxyl ions to the quartz molecules along the crystal surface. It is believed that, in response to thermal agitation, the hydroxyl ions may shift from one bonding point to another bonding point along the lattice structure of the crystal surface. The breaking and making of the bonds during such jumping appears as a self-induced noise, sometimes referred to as flicker noise, which limits the short-term stability of the SAW device. The noise is observed at the terminals of the SAW device, and is manifested both electrically and mechanically because of the piezoelectric nature of the crystal.

SUMMARY OF THE INVENTION

The foregoing problem is overcome and other advantages are provided by a SAW device which provides improved stability for electrical circuits incorporating the SAW device. In one aspect of the invention, the SAW device provides improved short-term stability, such as the short-term frequency stability of an oscillator circuit incorporating the SAW device. In a second aspect of the invention, the SAW device provides improved long-term stability, such as the long-term frequency stability of an oscillator circuit incorporating the SAW device. In both aspects of the invention, the stability is improved by a reduction in the induced self-noise of the SAW device. The reduction in the self-noise permits the use of generators employing SAW devices in low-noise situations.

With respect to the short-term stability, the invention provides for a reduction of the foregoing self-induced noise by a passivation of the surface of the crystal so as to prevent the foregoing making and breaking of the bonds between the hydroxyl ions and the quartz molecules. The passivation is accomplished by coating the surface of the crystal with a wetting agent having a surface tension much lower than that of water. The wetting agent appears to form a bond with the hydroxyl ions to prevent the foregoing jumping from lattice point to lattice point, and also to act as a diffusion barrier to prevent further diffusion of atmospheric water molecules through the coating of the wetting agent to the surface of the crystal.

In a preferred embodiment of the invention, the coating is accomplished by use of a silicone polymer such as methyl silicone, one such silicone being produced by Dow Corning, identified as type DC200. Alternatively, a silicone coating under the name of Dexsil and manufactured by Applied Science Laboratories of the State College of Pennsylvania, identified as type 300GC, may be utilized, A dilute solution of the polymer is applied to the crystal surface, the solvent then evaporating leaving a coating having a depth of a few monolayers of the silicone polymer on the crystal surface. The Dexsil coating is a combination of a carborane and siloxane, while the methyl silicone is a polymer of silicone monoxide with each section of the polymeric chain having methyl radicals attached thereto. The bonding of the coating to the crystal is then stabilized by baking the crystal. The silicon coating is chemically similar to rubbber, and may be referred to as a room temperature vulcanizer since curing is accomplished at room temperature.

With respect to the long-term stability, the invention provides for a cover which is fabricated of the same crystalline material as the crystal base which supports the electrode structure, the cover being placed over the electrode structure and secured to the crystal surface at the periphery thereof. The central region of the cover is recessed, or alternatively the central portion of the crystal surface is recessed, to provide a gap between the cover and the electrode structure to insure the propagation of the acoustic surface wave along the crystal surface. The cover provides both physical protection to the electrode structure and prevents the absorption of impurities from the atmosphere along the interface between the electrodes and the crystal surface. Since the cover and the base of the SAW device are fabricated of the same crystalline material, both the cover and the base have the same thermal coefficient of expansion with the result that no introduction of thermally induced dimensional changes occur as is associated with the utilization of materials of differing coefficients of expansion. Since the silicon material is also hydrophobic, the coating is advantageously utilized as a gasket in securely mounting the cover to the base.

BRIEF DESCRIPTION OF THE DRAWINGS

The aforementioned aspects and other features of the invention are explained in the following description taken in connection with the accompanying drawings wherein:

FIG. 6 shows a section of the base taken along the lines 6—6 of FIG. 3, the successive views describing successive steps in the construction of the electrodes, and of the recessing of the electrodes in the crystal surface, to provide an array of electrodes.

DESCRIPTION OF THE PREFERRED EMBODIMENT

Figure 1:
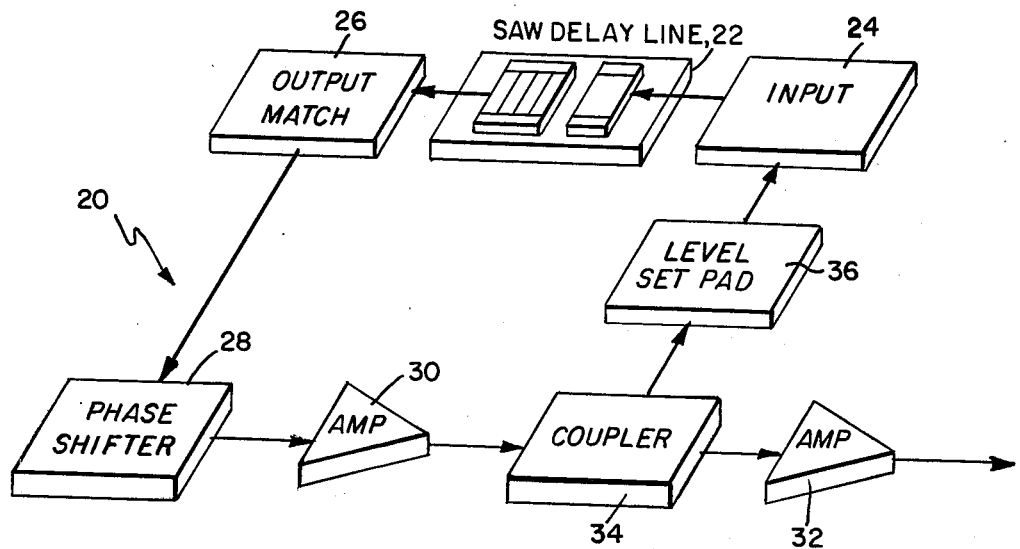
FIG. 1 shows a typical oscillator circuit incorporating a SAW device in its feedback loop, a SAW device constructed in accordance with the invention being advantageously utilized in the oscillator circuit.

Referring now to FIG. 1, there is seen an oscillator circuit 20 comprising a delay line 22, an input impedance matching circuit 24, an output impedance matching circuit 26, a variable phase shifter 28, amplifiers 30, 32, a coupler 34 and a variable attenuator 36. Th attenuator 36, the input matching circuit 24, the delay line 22, the output matching circuit 26 and the phase shifter 28 comprise a feedback loop for the amplifier 30. A portion of the output signal of the amplifier 30 is coupled via the coupler 34 to the amplifier 32 to serve as the output signal of the oscillator circuit 20. The remaining portion of the output signal of the amplifier 30 is coupled via the coupler 34 to the feedback loop. The amplifier 32 provides sufficient power to the output signal to enable the oscillator circuit 20 to be utilized for driving other electronic circuitry (not shown). The amplifier 30 provides the loop gain for oscillation within the circuit 20, the loop gain being adjustable by the attenuator 36.

The appropriate phase shift of a signal propagating around the feedback loop is provided by the delay line 22 and the phase shifter 28. The major portion of the phase shift is provided by the delay line 22 while the phase shifter 28 provides adjustment of the phase shift so as to enable the circuit 20 to oscillate at a desired frequency as is preset by adjustment of the phase shifter 28. The delay line 22 is advantageously constructed as a surface acoustic wave (SAW) device to stabilize the amount of phase shift imparted to a signal circulating around the feedback loop. The input and output impedance matching circuits 24 and 26 facilitate the coupling of electric signals, as is well known, between the delay line 22 and the other elements of the feedback loop.

Figure 2:
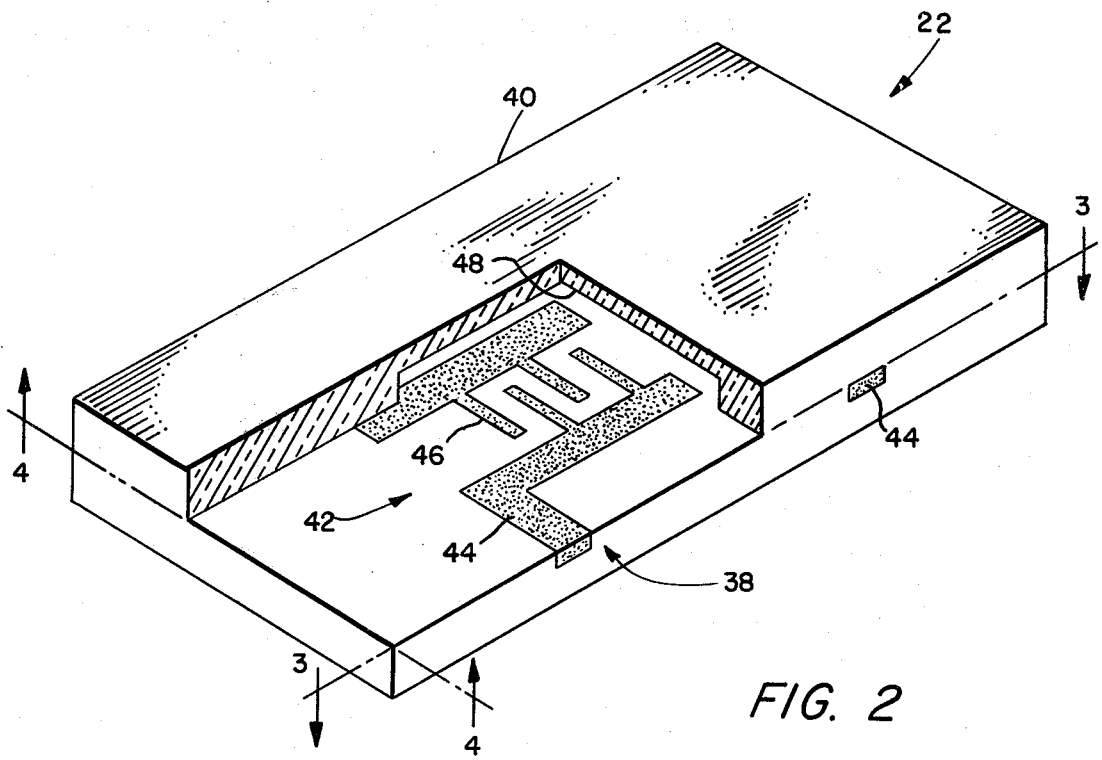
FIG. 2 is an isometric view of a SAW device constructed in accordance with the invention, a cover of the SAW device being partially cut away to show the base, a part of an electrode structure thereon also being seen.

Referring now to FIG. 2, there is seen the delay line 22, of FIG. 1, fabricated as a SAW device. In accordance with the invention, the delay line 22 of FIG. 2 comprises two portions, namely, a base 38 and a cover 40 which are fabricated of the same crystalline piezoelectric material, preferably quartz as is utilized in the preferred embodiment of the invention. One array of electrodes, namely, the output array 42 is partially seen in FIG. 2, the array of electrodes comprising bus bars 44 with fingers 46 attached thereto. As shown, alternate ones of the fingers 46 are coupled to alternate ones of the bus bars 44. Also, it is seen that the electrodes are recessed in the surface of the base 38 to promote a uniform propagation of the surface acoustic wave, such recessing being more readily seen by examining the end of a bus bar 44 where it exits through the side of the base 38. Also, at the cut-away portion of the cover 40, there is shown the edge of a recessed region 48 within the cover 40, the edge of the region 48 being greatly exaggerated so as to make the region 48 visible. The depth of the region 48, by way of example, is dependent on the frequency of oscillation with a depth of 5 microns having been utilized in the preferred embodiment at a frequency of 310 megahertz (MHz).

Figure 3:
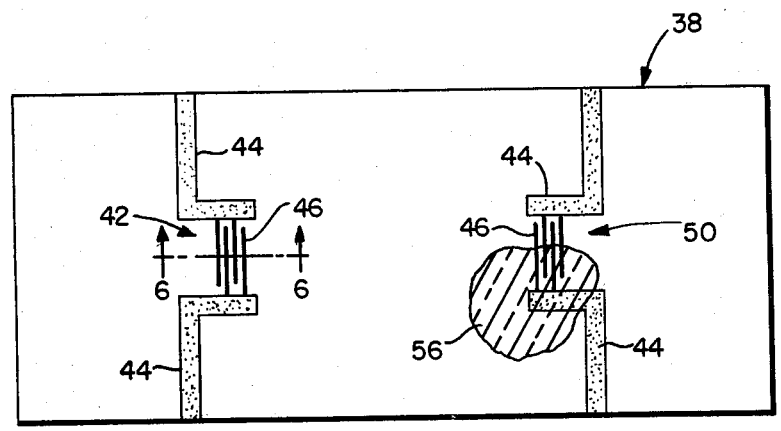
FIG. 3 is a plan view, taken along the lines 3—3 of FIG. 2, of the base of the SAW device showing the electrode structure.

Referring now to FIG. 3, the plan view of the base 38 shows the output array of electrodes 42 and an input array of electrodes 50. By way of example, four fingers 46 are shown in each of the arrays 42 and 50, it being understood that, in practice, many more fingers 46 would be utilized for providing high directivity to the arrays for directing sonic waves along the surface of the base 38, the longer arrays also being of narrow bandwidth for providing oscillation of the circuit 20 of FIG. 1 more accurately at a predetermined frequency of oscillation. The arrays 42 and 50 are spaced apart to provide sufficient delay to a signal propagating between the input and output arrays 50 and 42. The ends of the bus bars 44 of each of the arrays 42 and 50 are brought out through the side wall of the base 38 to serve as terminals for making electrical contact between the impedance matching circuits 26 and 24, respectively.

Figure 4:
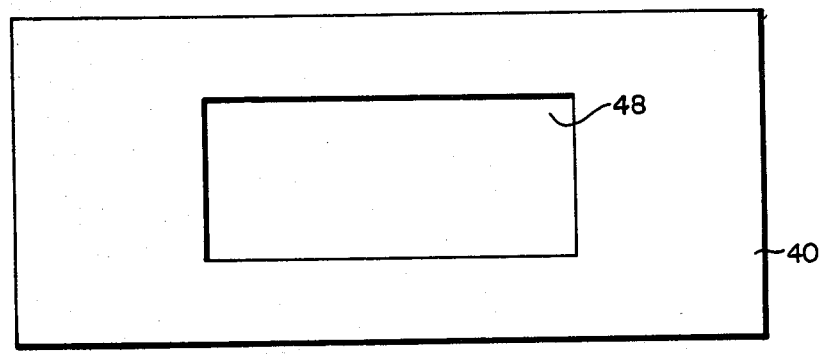
FIG. 4 is a plan view of the cover, taken along the lines 4—4 of FIG. 2, showing a recessed region thereof for providing a gap between the cover and the electrode structure, the gap extending over the region between the input and output arrays of electrodes.
Figure 5:
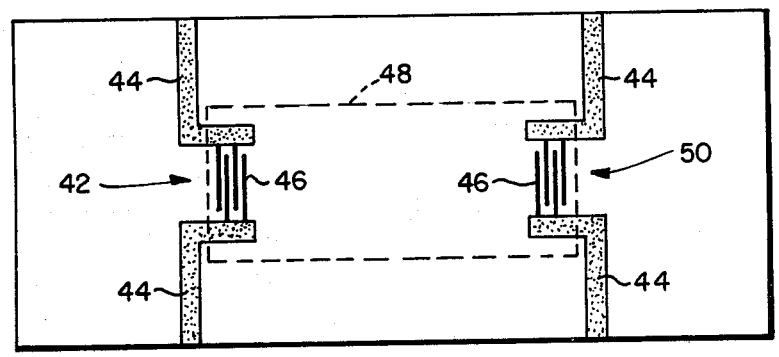
FIG. 5 is a plan view of the base of the SAW device, as in FIG. 3, FIG. 5 showing the superposition of a view of the recessed portion of the cover above the arrays of electrodes and the region therebetween, the recessed region being indicated by a dashed rectangle.

Referring now to FIGS. 4 and 5, there is seen the cover 40 with its recessed region 48, the region 48 having been described earlier with reference to FIG. 2. The dashed rectangle in FIG. 5 shows the location of the recessed region 48 relative to the arrays 42 and 50 when the cover 40 has been secured to the base 38. The ends of the bus bars 44, the fingers 46, and the region of the crystal surface over which the sonic wave propagates are located beneath the recessed region 48 of the cover 40. Alternatively, if desired, the central portion of the base 38 may be recessed prior to the deposition of the electrode structures of the arrays 42 and 50, in lieu of the recessing of the region 48 in the cover 40, to provide a gap between the crystal surface and the cover 40 so that the sonic wave can propagate along the crystal surface without a coupling of the wave into the cover 40.

Referring now to FIG. 6, the top view represents an early stage in the process of deposition of the fingers 46 of FIGS. 2 and 3 upon the crystalline surface of the base 38. As seen in FIG. 6, the base 38 is fabricated of a crystal of silicon dioxide, or quartz, with a layer of vanadium 52 deposited on the surface. A layer of photoresist 54 has been deposited on the vanadium layer 52. The procedure is as follows. The vanadium layer 52 is deposited on the surface of the substrate in order to provide adhesion for the photoresist material to the base 38, and also to facilitate a subsequent lift off of the photoresist layer 54. The vanadium layer 52 has a thickness of approximately 1000 Å (Angstroms). The vanadium is evaporated in a vacuum by means of a well-known technique utilizing an electron gun within the vacuum chamber, the high-speed electrons causing the vanadium atoms to boil off and become deposited on the quartz base 38.

Next, the photoresist layer 54 is exposed to light via a mask (not shown), and then the exposed photoresist material is washed away with developer as is well known in the photolithographic production of electronic microcircuits. The lifting off the photoresist results in exposed portions of the vanadium having the desired pattern of the electrode structure. The vanadium is then removed by a process of plasma etching wherein a reactive gas, such as a mixture of carbon tetrafluoride and oxygen, is applied to the vanadium layer 52 under very low vacuum pressures, typically 1 torr. The gas becomes active by means of an electrical discharge within the vacuum chamber (not shown), the discharge splitting the gas atoms to give free radicals which then attack the vanadium. The resulting configuration of the quartz base 38, which has become visible by the foregoing removal of the exposed photoresist material and the vanadium lying thereunder, is seen in the first view of FIG. 6.

The fabrication process continues with the second view, or step, of FIG. 6 wherein the quartz is etched to a depth of approximately 1000 Å by a plasma etching technique using the gas, argon, which is activated by an electrical discharge. The activated atoms of argon etch the quartz substrate by a process of physical erosion which is effected by the high atomic velocities.

The next step, as seen in the third view of FIG. 6, is accomplished by the evaporation of aluminum in a vacuum for depositing the aluminum onto the quartz using the same process as was described above for the deposition of the vanadium. The aluminum is deposited both within the etched portions of the quartz as well as on the photoresist layer 54. The aluminum is deposited within the etched portions of the quartz to a sufficient depth to bring the top surface of the aluminum layer flush with the surface of the quartz base 38.

Referring to the next step as shown in the fourth view of FIG. 6, the photoresist is removed with acetone, the removal of the photoresist layer 54 carrying off the aluminum thereupon. Then, the aforementioned technique of plasma etching with the mixture of carbon tetrafluoride and oxygen is applied to the vanadium layer 52 for removal of the vanadium layer 52. The resulting configuration, as shown in the fourth view of FIG. 6, results in the desired configuration of the electrode fingers 46 as recessed within the surface of the quartz base 38.

The fabrication process is continued with a cleaning of the base 38 with a cleaning agent such as carbon tetrafluoromethane which is commercially available under the name Freon 14. After cleaning the base 38, a coating 56 (a portion thereof seen in FIG. 3) is applied over the top of the base 38, the coating 56 covering the arrays of electrodes 42 and 50 as well as the path at the quartz surface along which the surface acoustic wave propagates. The coating 56 is formed of a hydrophobic wetting agent having a surface tension substantially less than that of water. The invention has been built utilizing a coating of methyl silicone such as that produced by Dow Corning, identified as type DC200, or, alternatively, a silicone coating under the name of Dexsil and manufactured by Applied Science Laboratories of the State College of Pennsylvania, identified as type 300GC. The Dexsil coating is a combination of a carborane and siloxane, while the methyl silicone is a polymer of silicon monoxide having each section of the polymer chain structured with methyl radicals attached thereto. The silicone coating is applied by dissolving approximately 1 milliliter of the silicone in one liter of a solvent such as acetone or toluene and then applying the solvent to the surface of the quartz base 38. The silicone material precipitates from the solvent onto the crystal surface until a layer having a depth of a few monolayers of the polymer has been deposited. Thereupon, the excess solution is removed leaving the desired coating. The polymer is also applied to the interfacing surface of the cover 40 including the recessed region 48 of the cover 40.

After applying the coating to the base 38 and the cover 40, both the base 38 and the cover 40 are baked in a vacuum, approximately $10^{-9}$ torr, to drive out any entrapped water molecules by diffusion outwardly through the polymer coating. The vacuum prevents oxidation of the polymer of the coating 56. A baking temperature up to 250° C. may be utilized for the methyl silicone, while temperatures as high as 450° C. may be utilized for the Dexsil coating. Ultraviolet radiation is then applied, the quartz being transparent to the ultraviolet radiation, to further polymerize the silicone polymer. The ultraviolet radiation is applied, preferably, in a vacuum. Thereupon, the cover 40 and the base 38 are pushed together, as by hand pressure having a force of typically five pounds, and preferably in a vacuum. Alternatively, the cover 40 and the base 38 may be pressed together prior to the application of the ultraviolet radiation. The resulting structure is the delay line 22 of FIG. 2. Since the silicone material provides a passivation of the surfaces of the base 38 and the cover 40, and since the silicone material is hydrophobic, the coatings of the silicone material on both the base 38 and the cover 40 serve as a gasket in the joining of the cover 40 to the base 38 to provide a secure bond of the cover 40 to the base 38 for inhibiting the entry of any impurities from the atmosphere.

It is understood that the above-described embodiment of the invention is illustrative only and that modifications thereof may occur to those skilled in the art. Accordingly, it is desired that this invention is not to be limited to the embodiment disclosed herein but is to be limited only as defined by the appended claims.

What is claimed is:

1. A surface acoustic wave device comprising:
    a crystalline base;
    an assembly of electrodes deposited on a surface of said base; and
    means for passivating said surface comprising a coating deposited on said surface and on said electrode assembly, said coating being formed of a hydrophobic polymer.

2. A surface acoustic wave device comprising:
    a crystalline base;
    an assembly of electrodes deposited on a surface of said base;
    a coating deposited on said surface having said electrode assembly; and
    said coating being formed of a hydrophobic polymer and having a depth of not more than a few monolayers of said polymer.

3. A surface acoustic wave device comprising:
    a base portion of piezoelectric material, said base portion having a surface supporting an assembly of electrodes;
    a cover fabricated of said piezoelectric material and in contact with said base portion; and wherein
    said cover and said base portion provides a gap, between said cover and said base portion, in a region over said electrode assembly to permit the propagation of a sonic wave along the surface of said base portion without interaction with said cover.

4. A device according to claim 3 further comprising:
    means for passivating said electrode supporting surface of said base portion comprising a polymeric layer deposited on said electrode supporting surface.

5. A device according to claim 4 wherein said polymeric layer is not more than a few monolayers thick and substantially covers the surface of said piezoelectric material of said base portion.

6. A device according to claim 5 wherein electrodes of said electrode assembly and at least a portion of each terminal are recessed in said surface of said base portion.

* * * * *